(12) United States Patent
Yamada

(10) Patent No.: US 7,158,417 B2
(45) Date of Patent: Jan. 2, 2007

(54) SEMICONDUCTOR DEVICE AND METHOD FOR WRITING DATA INTO THE SEMICONDUCTOR DEVICE

(75) Inventor: Shigekazu Yamada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/090,716

(22) Filed: Mar. 25, 2005

(65) Prior Publication Data

US 2005/0213388 A1    Sep. 29, 2005

Related U.S. Application Data

(63) Continuation of application No. PCT/JP2004/04294, filed on Mar. 26, 2004.

(51) Int. Cl.
*G11C 16/26* (2006.01)
(52) U.S. Cl. .................. 365/185.22; 365/185.03; 365/185.2; 365/185.21
(58) Field of Classification Search .......... 365/185.22, 365/185.03, 185.2, 185.21
See application file for complete search history.

(56) References Cited

U.S. PATENT DOCUMENTS

| | | | | |
|---|---|---|---|---|
| 4,763,305 A | * | 8/1988 | Kuo ...................... | 365/185.22 |
| 4,811,294 A | * | 3/1989 | Kobayashi et al. ..... | 365/185.22 |
| 5,287,326 A | * | 2/1994 | Hirata .................... | 365/230.03 |
| 5,668,756 A | | 9/1997 | Tomioka ................ | 365/185.03 |
| 5,777,923 A | * | 7/1998 | Lee et al. .............. | 365/185.11 |
| 6,026,015 A | | 2/2000 | Hirakawa .............. | 365/185.03 |
| 6,052,315 A | | 4/2000 | Katayama et al. ..... | 365/189.05 |
| 6,075,727 A | * | 6/2000 | Morton et al. ......... | 365/185.22 |
| 6,525,961 B1 | * | 2/2003 | Rolandi et al. ........ | 365/185.03 |
| 6,606,266 B1 | * | 8/2003 | Tsuruda ................. | 365/185.03 |
| 6,922,362 B1 | * | 7/2005 | La Malfa et al. ....... | 365/185.28 |
| 6,937,523 B1 | * | 8/2005 | Eshel .................... | 365/185.28 |
| 2002/0031038 A1 | | 3/2002 | Honda et al. .......... | 365/230.03 |
| 2003/0112662 A1 | | 6/2003 | Tanzawa et al. ....... | 365/185.11 |

FOREIGN PATENT DOCUMENTS

| | | |
|---|---|---|
| JP | 8-235886 | 9/1996 |
| JP | 10-334674 | 12/1998 |
| JP | 11-25681 | 1/1999 |
| JP | 2001-325795 | 11/2001 |
| JP | 2002-216485 | 8/2002 |
| JP | 2003-77284 | 3/2003 |
| JP | 2004-22061 | 1/2004 |

* cited by examiner

*Primary Examiner*—Tan T. Nguyen

(57) ABSTRACT

A semiconductor device is provided which includes a memory part that includes memory cells having different threshold values; a read circuit that reads data from a memory cell to be programmed with write data that is input; and a detection circuit that compares the write data with the data read from the memory cell to thus detect a pattern in which programming of data causes erasing. The pattern that causes erasing during the programming is processed as an inhibited operation. If the inhibited operation is identified, the process is forcedly terminated without initiating the programming by the write command. This makes it possible to avoid erasing resulting from the programming.

10 Claims, 15 Drawing Sheets

F I G . 1 3
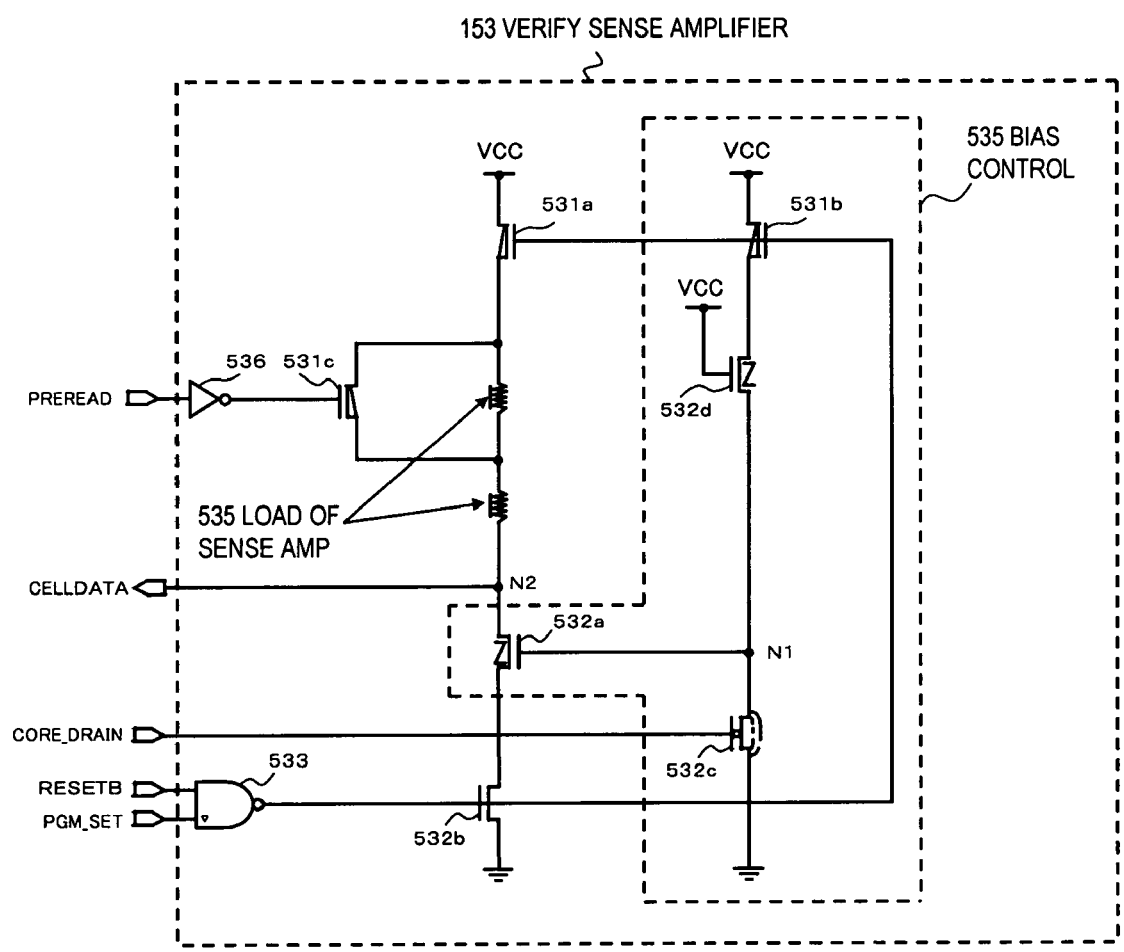

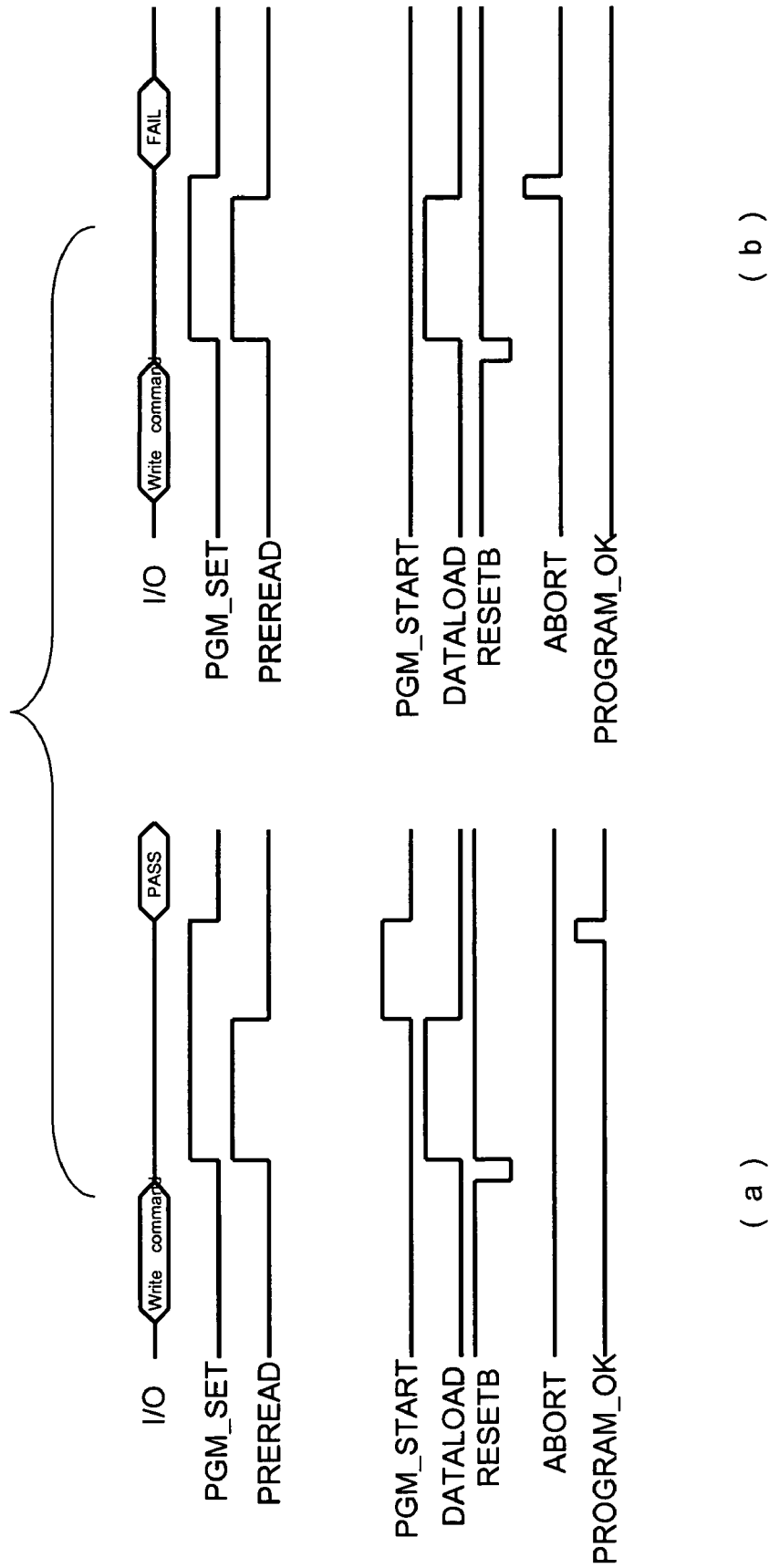

SEMICONDUCTOR DEVICE AND METHOD FOR WRITING DATA INTO THE SEMICONDUCTOR DEVICE

CROSS REFERENCE TO RELATED APPLICATIONS

This is a continuation of International Application No. PCT/JP2004/004294, filed Mar. 26, 2004.

BACKGROUND OF THE INVENTION

1. Field of the Invention

The present invention relates to a semiconductor device and a method for writing data into the semiconductor device. More particularly, the present invention relates to a semiconductor device having multi-bit memory cells and a method for writing data into the multi-bit memory cells.

2. Description of the Related Art

Recently, semiconductor memory devices such as flash memories have been demanded to have an increased memory capacity. A multi-bit semiconductor memory device has been proposed to meet the above demand. This kind of semiconductor memory devices is proposed in Japanese Patent Application Publication Nos. 8-235886 and 2002-216485. These publications show that two bits or more can be stored in a memory cell.

In the semiconductor memory device with multi-bit memory cells, 2-bit information can be stored in a memory cell with four levels described as 1, 2, 3 and 4. Each of the four levels corresponds to a respective one of four combinations of two bits of input or output data. The levels 1, 2, 3 and 4 are respectively defined as 2-bit input or output data (1, 1), (0, 1), (1, 0) and (0, 0). Here, data "0" is defined as a programmed state, and data "1" is defined as an erased state. Programming of the memory cell changes the data stored therein from "1" to "0", and erasing changes the data from "0" to "1". Generally, the flash memories are inhibited from changing the data "0" in the memory cell to data "1" by a write command.

When the flash memory is supplied with a write command for changing the threshold voltage Vth of the memory cell that is in the state of level-2 to level 3, the actual programming operation changes data in the memory cell from (0, 1) to (1, 0). That is, one of the two bits changes from data "0" to data "1". This means that erasing is performed in the programming.

SUMMARY OF THE INVENTION

The present invention intends to solve the above-mentioned problem in the prior art and provide a semiconductor device and a method for programming in which erasing can be avoided during programming.

The present invention includes a semiconductor device including: a memory part that includes memory cells having different threshold values; a read circuit that reads data from a memory cell to be programmed with write data that is input; and a detection circuit that compares the write data with the data read from the memory cell to thus detect a pattern in which programming of data causes erasing. The above problem can be solved by detecting the pattern causing erasing during programming.

The detection circuit may be configured so that it generates a signal that inhibits programming of the write data.

The semiconductor device may be configured so that it further comprises a sense amplifier for verification, wherein the read circuit reads data from said memory cell through the sense amplifier for verification. In this configuration, preferably, the read circuit reads data from said memory cell twice through the sense amplifier for verification.

The semiconductor device may be configured so as to further comprise a sense amplifier for verification, wherein the read circuit reads data from said memory cell by using the sense amplifier for verification so that the data read from said memory cell is compared with specific reference cells provided separate from reference cells for verification.

The semiconductor device may be configured so as to further comprise a sense amplifier for verification, wherein the read circuit reads data from said memory cell by using the sense amplifier for verification so that the data read from said memory cell is compared with reference cells for verification. In this configuration, preferably, the sense amplifier for verification has a transistor circuit that shifts a read level at which data is read from said memory cell.

The semiconductor device may be configured so that it further includes a sense amplifier for verification, wherein the read circuit reads data from said memory cell by using the sense amplifier for verification at a specific sense ratio different from that used for verification.

The semiconductor device may be configured so that the memory part includes banks that are simultaneously operable. In this configuration, preferably, the memory part includes banks that are simultaneously operable, and the banks share the read circuit and the detection circuit.

The semiconductor device may be configured so that the read circuit includes a sense amplifier for reading data from the memory part.

The semiconductor device may be configured so as to further include a circuit that outputs a result of detection by the detection circuit to an outside of the semiconductor device.

The present invention is a method of programming data into memory cells having different threshold values comprising the steps of: reading data from a memory cell to be programmed with write data that is input; and comparing the write data with the data read from the memory cell to thus detect a pattern in which programming of data causes erasing. The method may include a step of generating a signal that inhibits programming of the write data when the pattern is detected. In the semiconductor device and the method, the different threshold values may be three or more different threshold values.

BRIEF DESCRIPTION OF THE DRAWINGS

FIG. 13 is a diagram of a circuit configuration of a sense amplifier for verification employed in the second embodiment;

FIG. 16 is a timing chart of a programming operation in the third embodiment.

DESCRIPTION OF THE PREFERRED EMBODIMENTS

A description will now be given, with reference to the accompanying drawings, of embodiments of the present invention.

First Embodiment

Figure 1:
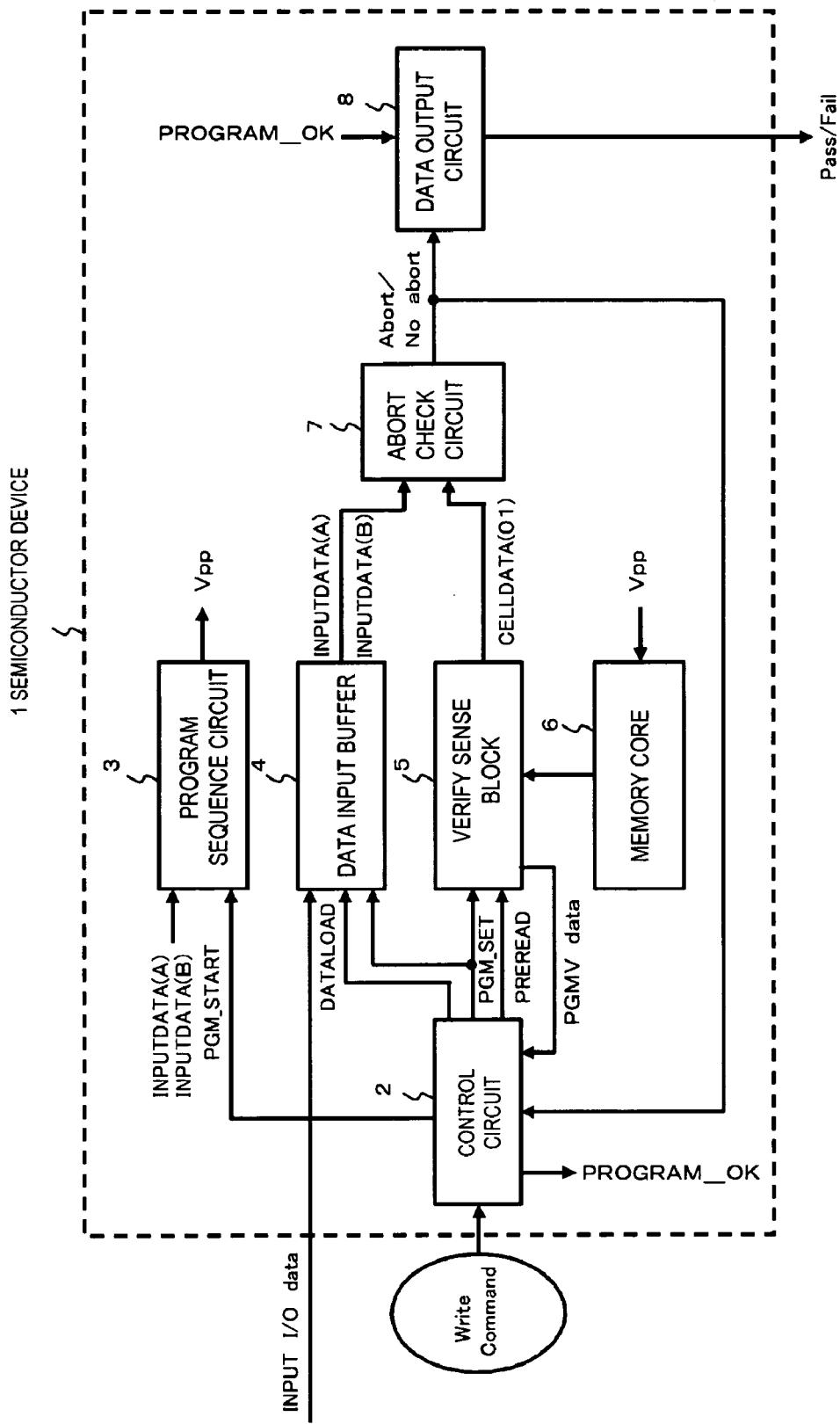
FIG. 1 is a block diagram of a semiconductor device according to a first embodiment of the present invention.

FIG. 1 is a block diagram of a semiconductor device according to a first embodiment of the present invention. As is shown in FIG. 1, a semiconductor device 1 is equipped with a control circuit 2, a program sequence circuit 3, a data input buffer 4, a verify sense block 5, a memory core 6, an abort check circuit 7, and a data output circuit 8. The semiconductor device 1 is a multi-bit flash memory with simultaneous operation (SO). For the sake of simplicity, a circuit block related to erasing is omitted.

The control circuit 2 sets a data read (pre-read) period for memory cells to be programmed just prior to programming in order to detect a pattern that causes erasing during programming. The program sequence circuit 3 actually programs the memory cells by applying a programming voltage Vpp thereto. The semiconductor device 1 may be a semiconductor memory device packaged or may be a part of a semiconductor device such as a system LST.

The data input buffer 4 converts input write data INPUT I/O DATA into INPUTDATA(A) and INPUTDATA(B), which are applied to the abort check circuit 7. The INPUTDATA(A) and INPUTDATA(B) represent the level of data to be written into a single memory cell. The memory core 6 is a memory part of the semiconductor device 1 and is composed of memory cells each capable of storing multiple bits with different threshold values. There are many several types of memory cells having the above capability, and an arbitrary type of multi-bit memory cells may be employed.

The verify sense block 5 reads out the data existing in a memory cell from the memory core 6, and supplies the existing data CELLDATA(01) of this memory cell to the abort check circuit 7. The SO function allows data to be read from a bank during the programming of another bank, so that the read sense amplifier cannot be used. Taking the above into consideration, the read circuit involved in programming uses a verify sense amplifier 53, which will be described later. After entering into the regular programming phase, data are read from the memory cell by a programming verify operation, and are supplied to the control circuit 2 as data PGMV_data. When the control circuit 2 determines that programming is normally completed, the control circuit 2 supplies a signal PROGRAM_OK to the data output circuit 8, which outputs a pass signal to the outside of the semiconductor device 1.

The abort check circuit 7 compares the input write data INPUTDATA with the existing data CELLDATA(01) in the memory cell, and detects a pattern that causes erasing during programming. If such a pattern is detected, the abort check circuit 7 generates an abort signal. In contrast, if the pattern causing erasing during programming is not detected, the abort check circuit 7 generates a no_abort signal. These signals are supplied to the data output circuit 8 and the control circuit 2. The control circuit 2 stops programming in response to the abort signal. The data output circuit outputs a fail signal to the outside of the semiconductor device 1 in response to the abort signal. Thus, in case where there is the pattern causing erasing during programming, programming instructed by the write command is forcedly terminated without initiating the programming. It is thus possible to prevent the occurrence of an event in which erasing takes place during programming.

Figure 2:
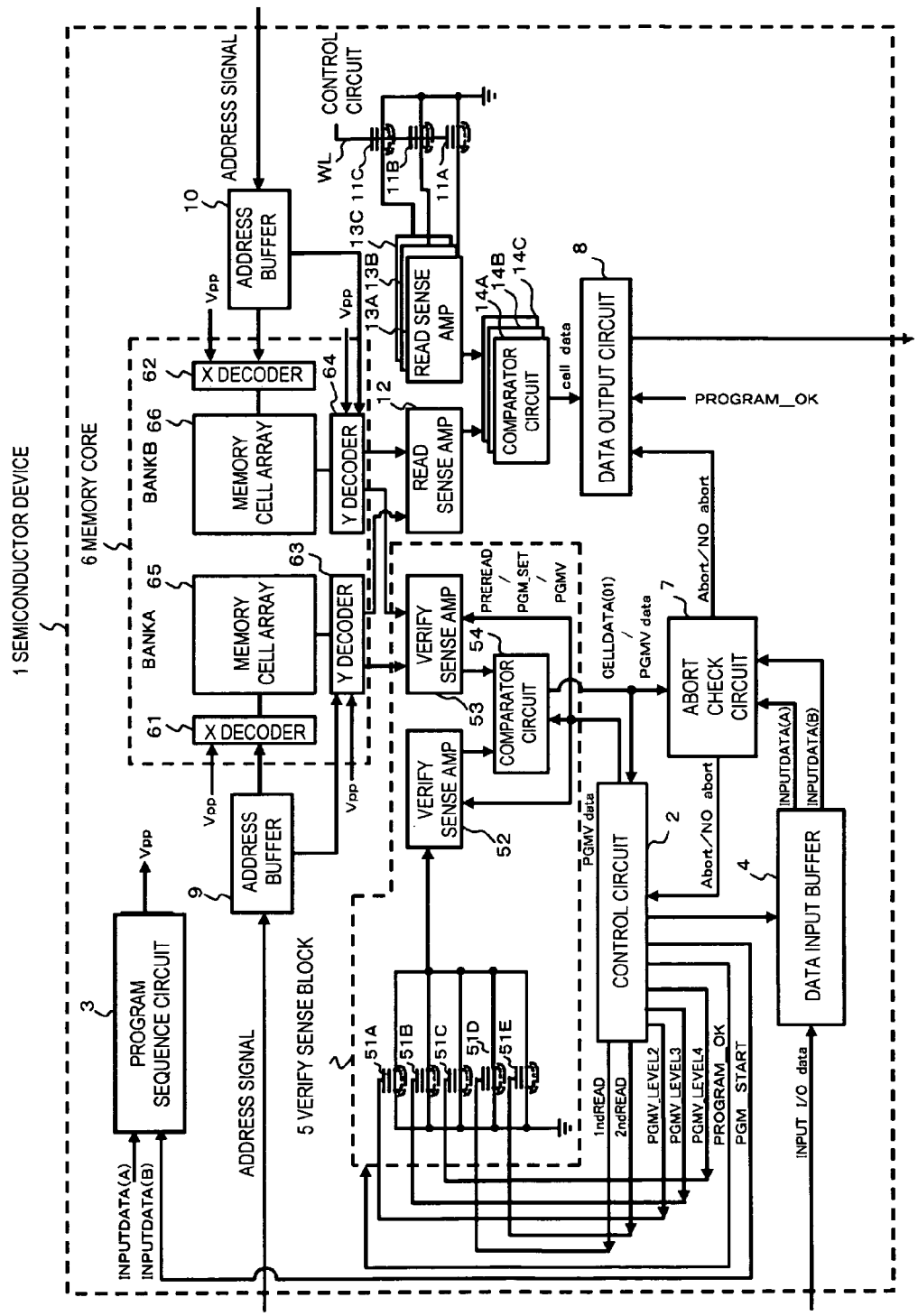
FIG. 2 is a detailed block diagram of the semiconductor device according to the first embodiment.

A detailed description will now be given of a block diagram of the semiconductor device 1 according to the first embodiment. FIG. 2 is a block diagram that illustrates the semiconductor device 1 according to the first embodiment in detail. As is shown in FIG. 2, the semiconductor device 1 includes the control circuit 2, the data input buffer 4, the verify sense block 5, the memory core 6, the abort check circuit 7, the data output circuit 8, address buffers 9 and 10, read reference cells 11A through 11C, read sense amplifiers 12 and 13A through 13C, and comparator circuits 14A through 14C.

The semiconductor device having the SO function has multiple banks, each of which is equipped with an independent addressing system. Data can be read from a bank during the programming or erasing of another bank. In order to avoid an increase of the chip area, the banks share the verify sense amplifier used at the time of programming and erasing, and share the read sense amplifier used at the time of reading.

The control circuit 2 receives control signals externally supplied from the outside of the semiconductor device 1 (such as a chip enable signal and a write enable signal) and control signals supplied from given command registers, and performs reading, programming and erasing based on the control signals. The data input buffer 4 is supplied with signals PGM_SET and DATALOAD from the control circuit 2, and converts write data INPUT_I/O_data externally supplied into data INPUTDATA(A) and INPUTDATA(B), which are then supplied to the abort check circuit 7. The address buffers 9 and 10 are used to latch the address signal externally supplied.

The memory core 6 has two memory banks BANKA and BANKB, which are respectively equipped with X decoders 61 and 62, Y decoders 63 and 64, and memory cell arrays 65 and 66. Each of the memory cell arrays 65 and 66 has electrically erasable and programmable non-volatile memory cells arranged in a matrix, word lines and bit lines. Each memory cell is capable of storing multiple bits with different threshold values.

The X decoders 61 and 62 decode X address signals that are parts of the address signals latched in the address buffers 9 and 10, and select memory cells in the memory cell arrays 65 and 66 designated by the decoded X addresses. The Y decoders 63 and 64 decode Y address signals that are parts of the address signals latched in the address buffers 9 and 10, and select memory cells in the memory cell arrays 65 and 66 designated by the decoded Y addresses.

The read sense amplifier 12 senses currents flowing in the selected memory cells in the memory cell arrays 65 and 66 at the time of reading data therefrom, and converts the sensed cell currents into corresponding voltages. The reference cells 11A through 11C are involved in detecting the levels of the selected cells. The three reference cells 11A–11C are simultaneously selected to enable quick sensing at the time of reading. The read sense amplifiers 13A through 13C sense the currents flowing through the reference cells 11A through 11C, and convert the sensed currents into corresponding voltages. The read sense amplifiers 13A through 13C cooperate with the reference cells 11A through 11C, respectively.

The comparator circuits 14A through 14C compare the data existing in the memory cells detected by the read sense amplifier 12 with the currents of the reference cells 11A through 11C sensed by the read sense amplifiers 13A through 13C to thus identify the levels of the data of the memory cells. The levels of the data thus read are output to the data output circuit 8 as cell data. The comparator circuits 14A through 14C respectively cooperate with the read sense amplifiers 13A through 13C to achieve the quick read processing.

The verify sense amplifier block 5 includes five reference cells 51A through 51D, verify sense amplifiers 52 and 53, and a comparator circuit 54. The three reference cells 51A through 51C among the five reference cells are used for the regular program verification. The remaining two reference cells 51D and 51E are used for prereading. The reference cell 51D is used for the first preread, and the reference cell 51E is used for the second preread following the first preread.

The verify sense amplifier 52 senses the currents flowing through the reference cells 51A through 51E, and converts the sensed currents into corresponding voltages. The verify sense amplifier 53 senses the current flowing through the memory cell of interest to read the existing data therein. At the time of prereading, the verify sense amplifier 53 reads the existing data in the memory cell twice. The comparator circuit 54 compares the existing data in the memory cell sensed by the verify sense amplifier 53 with the levels of the reference cells sensed by the verify sense amplifier 52, and determines the level of the existing data CELLDATA in the memory cell.

The abort check circuit 7 compares the write data INPUT-DATA read from the data input buffer 4 with the existing data CELLDATA in the memory cell supplied from the comparator circuit 54, and detects the pattern in which erasing takes place during programming. If the pattern is detected, the abort check circuit 7 supplies the abort signal to the control circuit 2 and the data output circuit 8, which circuits terminate the sequence without initiating programming. If the pattern is not detected, the abort check circuit 7 supplies the No_abort signal to the control circuit 2, which starts programming. The data output circuit 8 outputs a pass signal indicative of completion of programming in response to the No_abort signal to the outside of the semiconductor device 1, and outputs a fail signal indicating that the programming is inhibited to the outside of the semiconductor device 1 in response to the abort signal. At the time of regular reading, the data output circuit 8 outputs cell data to the outside.

The verify sense amplifier 53 and the abort check circuit 7 correspond to a read circuit and a detection circuit claimed, respectively.

Figure 3:
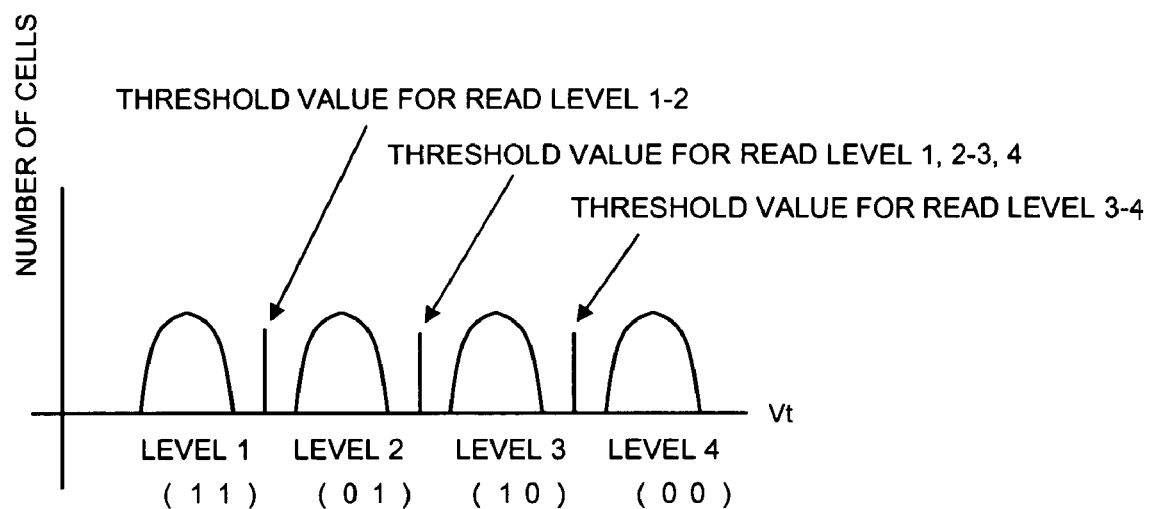
FIG. 3 shows threshold values Vth of a reference cell for reading.
Figure 4:
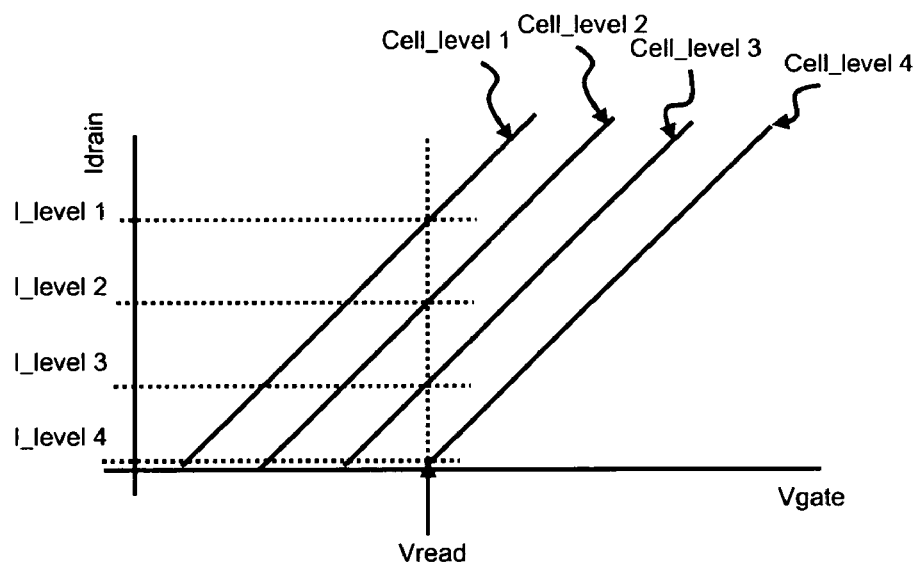
FIG. 4 shows voltages applied to a word line WL.

A description will now be given of the read operation in which data are read from the memory core 6 and are output to the outside of the semiconductor device 1. FIG. 3 is a graph explaining the threshold values Vth of the read reference cells 11. FIG. 4 is a graph explaining the voltage applied to the word lines WL. In FIG. 3, the horizontal axis denotes the threshold values of the memory cells, and the vertical axis denotes the number of memory cells. The threshold value of each memory cell has any of Level 1, Level 2, Level 3 and Level 4 based on data programmed. Level 1, Level 2, Level 3 and Level 4 correspond to two bits of data "11", "01" "10" and "00", respectively.

As shown in FIG. 3, the threshold values Vth are defined at midpoints between the adjacent levels of the memory cells. The threshold value Vth for "read level 1–2" is the threshold value of the reference cell 11A for discriminating between Level 1 and Level 2 of the memory cell. The threshold value Vth for "read level 1, 2–3, 4" is the threshold value of the reference cell 11B for discriminating between Levels 1, 2 and Levels 3, 4. The threshold value Vth for "read level 3–4" is the threshold value of the reference cell 11C for discriminating between Level 3 and Level 4.

As is indicated by IV curves shown in FIG. 4, the voltage (Vgate) applied to the word lines WL of the memory cell arrays 65 and 66 is determined so that the cell current (Idrain) at Level 4 is approximately zero. The word lines WL connected to the reference cells 11 are supplied with the same voltage as that applied to the word lines of the memory cell arrays 65 and 66. Thus, the different amounts of currents flow through the reference cells 11A through 11C with the different threshold values. The read sense amplifiers 13A through 13C convert the currents flowing through the reference cells 11A through 11C into corresponding voltages, which are then supplied to the three comparator circuits 14A through 14C, respectively. The comparator circuits 14A through 14C compare the levels of the memory cells with the reference voltages and identify the data in the memory cells. The data output circuit 8 outputs the cell data to the outside of the semiconductor device 1.

Figure 5:
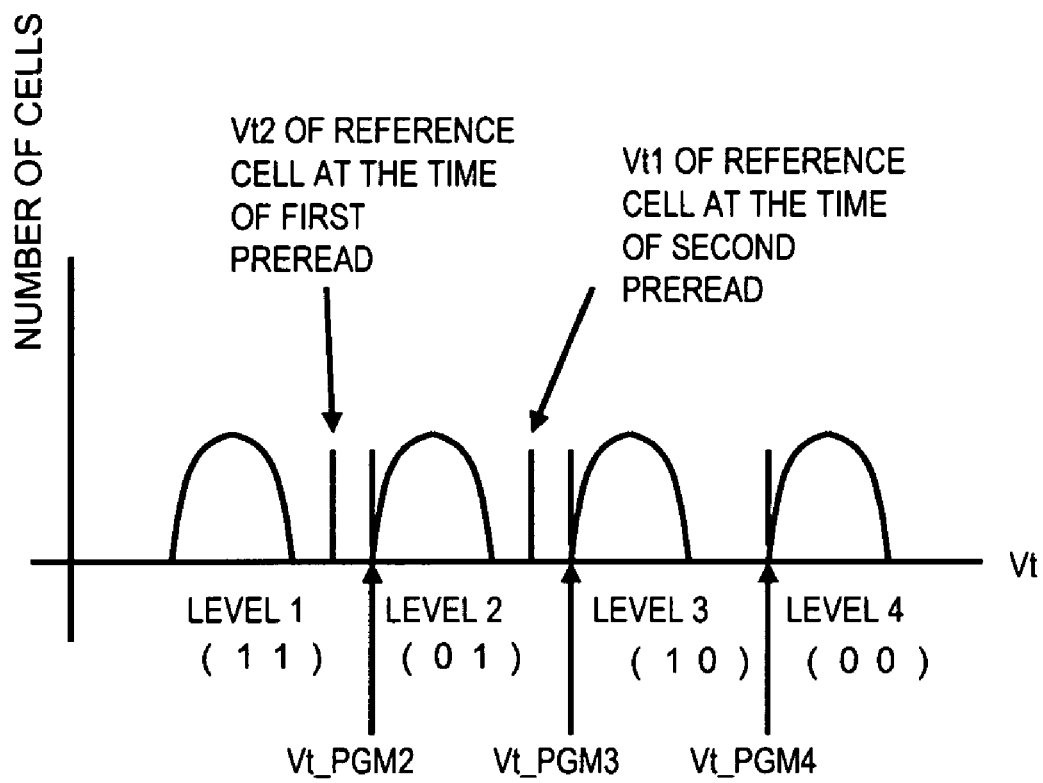
FIG. 5 shows threshold values Vth of a reference cell for programming and prereading.

FIG. 5 is a graph explaining the threshold values Vth of the reference cells 51 provided in the verify sense block 5. A threshold value Vth_PGM2 is the threshold value of the reference cell 51A used for verifying the programming so that it is determined whether the memory cell has been correctly programmed to Level 2 in the process of programming. A threshold value Vth_PGM3 is the threshold value of the reference cell 51B used for verifying the programming so that it is determined whether the memory cell has been correctly programmed to Level 3 in the process of programming.

A threshold value Vth_PGM4 is the threshold value of the reference cell 5 IC used for verifying the programming so that it is determined whether the memory cell has been correctly programmed to Level 4 in the process of programming. A symbol Vt1 is the threshold value of the reference cell 5 ID for the first preread. A symbol Vt2 is the threshold value of the reference cell 51E for the second preread.

As shown in FIG. 5, the threshold values Vt1 and Vt2 for preread are defined at midpoints between the adjacent levels of the memory cells. That is, these threshold values are the same as the threshold values Vth for read. According to the first embodiment, preread is implemented by providing the two reference cells 51D and 51E for preread without changing the load of the sense amplifier.

A description will now be given of programming. The verify sense amplifier 53 performs preread twice, so that the existing data stored in the memory cell to be programmed are read twice prior to initiation of programming. At the time of the first preread, the verify sense amplifier 53 senses the current flowing through the memory cell, and converts it into the corresponding voltage, which is supplied to the comparator circuit 54 as the existing data CELLDATA. The control circuit 2 applies the voltage to the word line connected to the reference cell 51D having the threshold value Vt1. The verify sense amplifier 52 senses the current flowing through the reference cell 51D, and converts it into the corresponding voltage, which is then supplied to the comparator circuit 54 as reference data. The comparator circuit 54 refers to the reference data from the reference cell 51D, and determines whether the existing data in the memory cell is at Levels 1, 2 or Levels 3, 4.

At the time of the second preread, the verify sense amplifier 53 senses the current flowing through the memory cell and converts it into the corresponding voltage, which is then supplied to the comparator circuit 54 as the existing data CELLDATA. The control circuit 2 applies the voltage to the word line connected to the reference cell 51E having the threshold voltage Vt2. If the existing data in the memory cell is in either Level 1 or Level 2, the verify sense amplifier 52 senses the current flowing through the reference cell 51E for the second preread, and converts it into the corresponding voltage, which is then supplied to the comparator circuit 54 as reference data involved in the second preread. The comparator circuit 54 refers to the above reference data from the reference cell 51E, and determines whether the existing data in the memory cell is at Level 1 or Level 2.

When the memory cell is at Level 2 and it is determined, by referring to INPUTDATA from the data input buffer 4, that a write command for programming the memory cell to Level 3 is input, the abort check circuit 7 generates the abort signal, which inhibits only the programming or handles the programming as error. In this manner, it is possible to prevent erasing from taking place during the programming. In cases other than the above, the abort check circuit 7 generates the No_abort signal, and the control circuit 2 generates a signal PGM_START for executing the programming. In response to this signal, the program sequence circuit 3 actually programs the memory cell.

Figure 6:
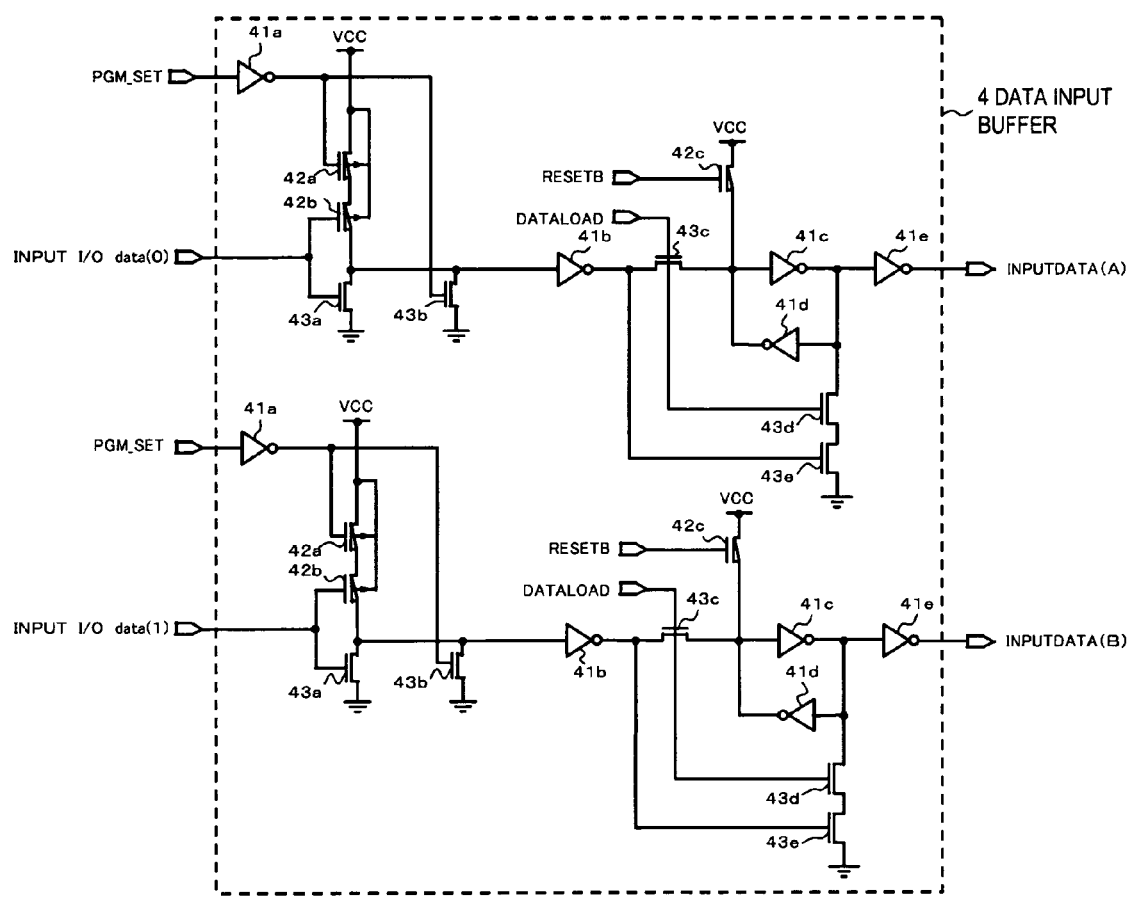
FIG. 6 is a diagram of a circuit configuration of a data input buffer.

A description will now be given of the data input buffer 4. FIG. 6 is a diagram of a structure of the data input buffer 4. As is shown in FIG. 6, the data input buffer 4 is made up of a circuit that outputs data INPUTDATA(A) and another circuit that outputs data INPUTDATA(B). Each of the two circuits is composed of inverters 41a–41e, PMOS transistors 42a–42c, and NMOS transistors 43a–43e. A VCC power supply line is used to supply power to the circuits. A symbol INPUT_I/O_data is a write signal externally supplied. A symbol INPUTDATA is write data.

The PMOS transistors 42a and 42b and the NMOS transistor 43a are connected in series between the power supply Vcc and ground Vss. The gates of the PMOS transistor 42a and NMOS transistor 43b are controlled by a signal obtained by inverting, by the inverter 41a, a signal PGM_SET generated when the control circuit 2 acknowledges the write command. The gates of the PMOS transistor 42b and NMOS transistor 43a are controlled by the signal INPUT_I/O_data. The inverters 41c and 41d and the NMOS transistors 43d and 43e form a latch circuit.

The gates of the NMOS transistors 43c and 43d are controlled by a signal DATALOAD from the control circuit 2. The gate of the PMOS transistor 42c is controlled by a reset signal RESETB. The data latched in the latch circuit is supplied to the abort check circuit 7 via the inverter 41e.

Figure 7:
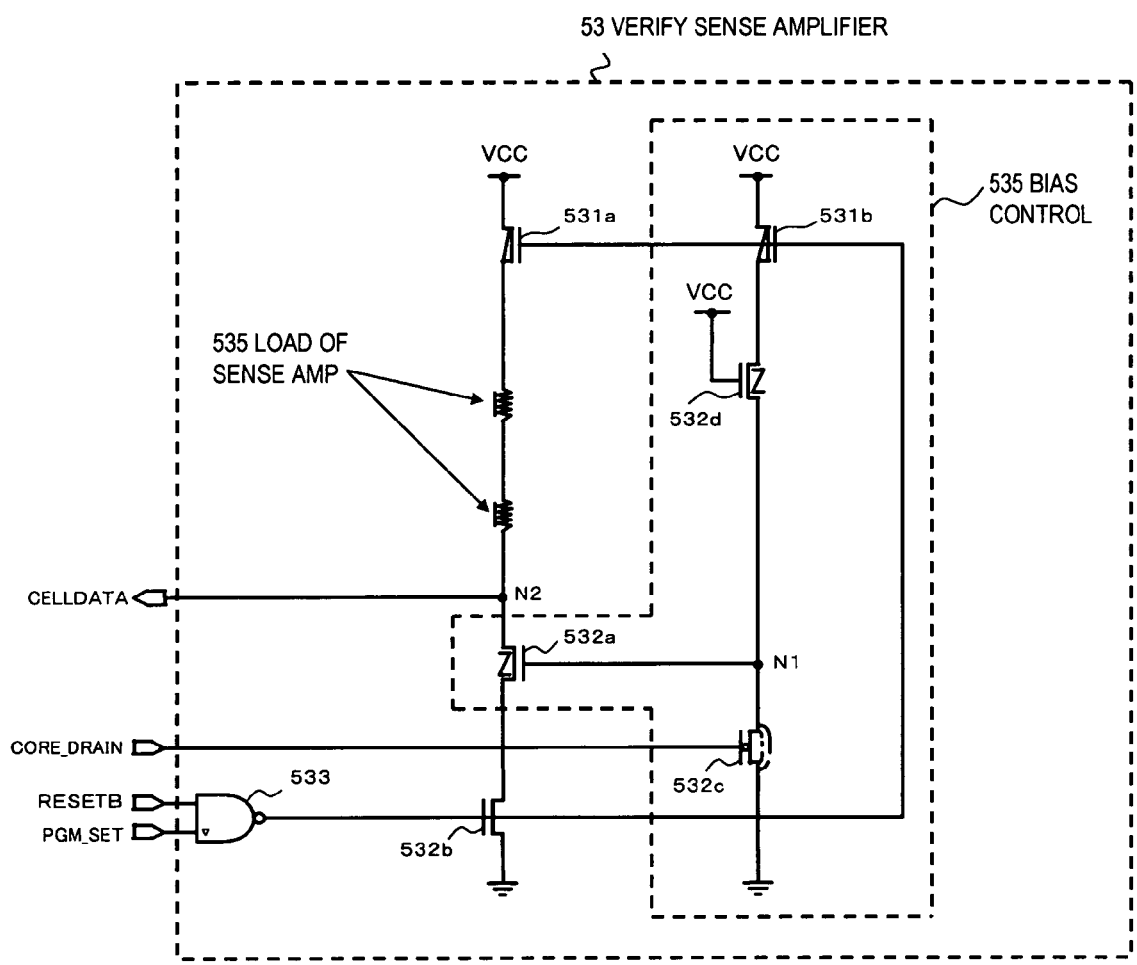
FIG. 7 is a diagram of a circuit diagram of a sense amplifier for verification.

A description will now be given of the verify sense amplifier 53. FIG. 7 is a diagram of a circuit configuration of the verify sense amplifier 53. As is shown in FIG. 7, the verify sense amplifier 53 includes PMOS transistors 531a and 531b, NMOS transistors 532a–532d, a NAND circuit 533 and a load 534. A bias circuit 535 is formed by the NMOS transistors 532a, 532c and 532d, and the PMOS transistor 532b. The PMOS transistor 531a, the load 534, and the NMOS transistors 532a and 532b are connected in series between the power supply Vcc and ground Vss.

Similarly, the PMOS transistor 531b, and the NMOS transistors 532d and 532e are connected in series between the power supply Vcc and ground Vss. The gates of the NMOS transistor 532b and PMOS transistors 531a and 531b are controlled by an output signal of a NAND operation on the signal PGM_SET and the reset signal RESETB. The gate of the NMOS transistor 532c is controlled by a current CORE_DRAIN flowing through the memory cell. The gate of the NMOS transistor 532a is controlled by the potential of a node N1 between the NMOS transistors 532d and 532c. The potential of a node N2 between the PMOS transistor 531a and the NMOS transistor 532a is supplied to the comparator circuit 54 as CELLDATA. The first embodiment employs the two reference cells 51D and 51E for preread, so that the preread can be realized without changing the load of the verify sense amplifier 53.

In the flash memory, the current flows in the read access. Thus, a voltage clamped at lower than 1 [V] is applied as the drain voltage of the memory cell in order to avoid erroneous programming thereof. In the embodiment, the node N2 is clamped at approximately 0.8 [V].

Figure 8:
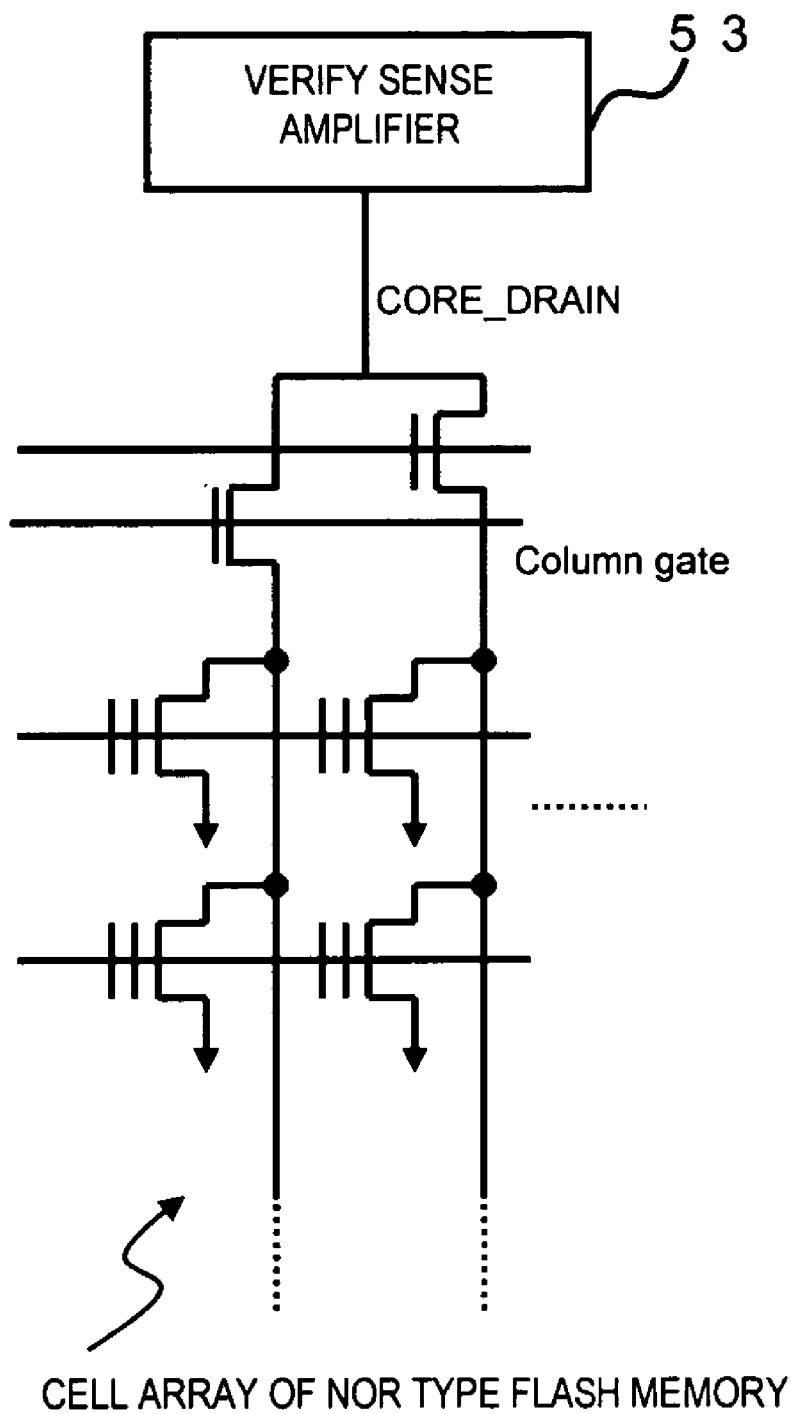
FIG. 8 shows detection of a current flowing through the sense amplifier for verification.

FIG. 8 shows current detection by the verify sense amplifier 53. In FIG. 8 shows an example of the NOR type flash memory. In the flash memory, the cell allows the current to flow when electrons are not charged in the floating gate of the cell, which holds data "1" in the erased state. In contrast, the cell does not allow the current to flow when electrons have been charged in the floating gate of the cell, which holds data "0" in the programmed state. The verify sense amplifier 53 senses the cell current CORE_DRAIN flowing in the memory cell, and converts it into the corresponding voltage, which is then supplied to the comparator circuit 54 as the existing data CELLDATA of the memory cell.

Figure 9:
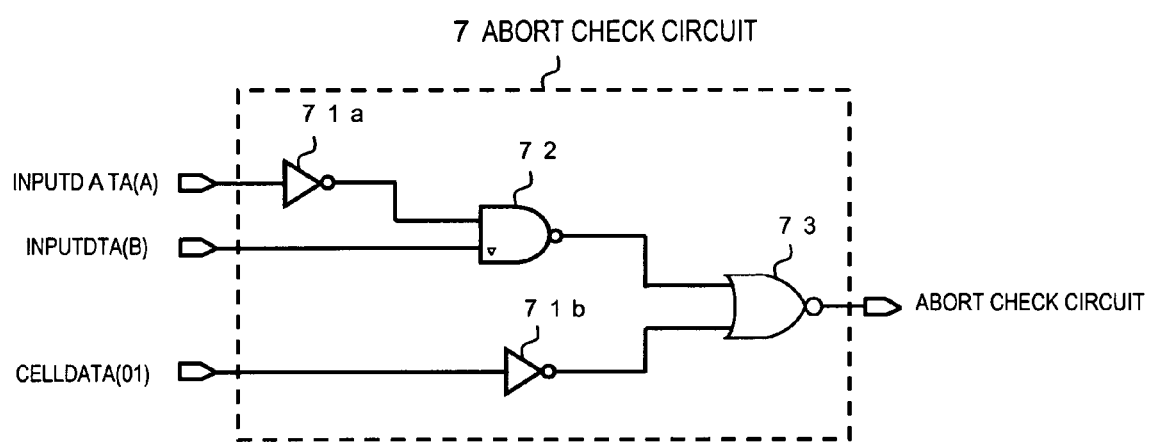
FIG. 9 is a diagram of a circuit configuration of an abort check circuit.

Now, the abort check circuit 7 will be described. FIG. 9 shows a configuration of the abort check circuit 7. As is shown in FIG. 9, the abort check circuit 7 includes inverters 71a and 71b, a NAND circuit 72 and a NOR circuit 73. The abort check circuit 7 compares the data generated by the verify sense amplifier 53 with the data from the verify sense amplifier 52, and generates the abort signal that is at HIGH when input data to be written into the memory cell is (1, 0) and the memory cell data existing therein is (0, 1). More specifically, the output of the NAND circuit 72 is LOW when INPUTDATA(A) is LOW and INPUTDATA(B) is HIGH. The output of the NOR circuit 73 is HIGH when the output of the NAND circuit 72 is LOW and CELLDATA is HIGH. That is, the abort check circuit 7 generates the high-level abort signal when a write command of programming the memory cell to Level 3 (10) is input and this memory cell is at Level 2 (01).

Figure 10:
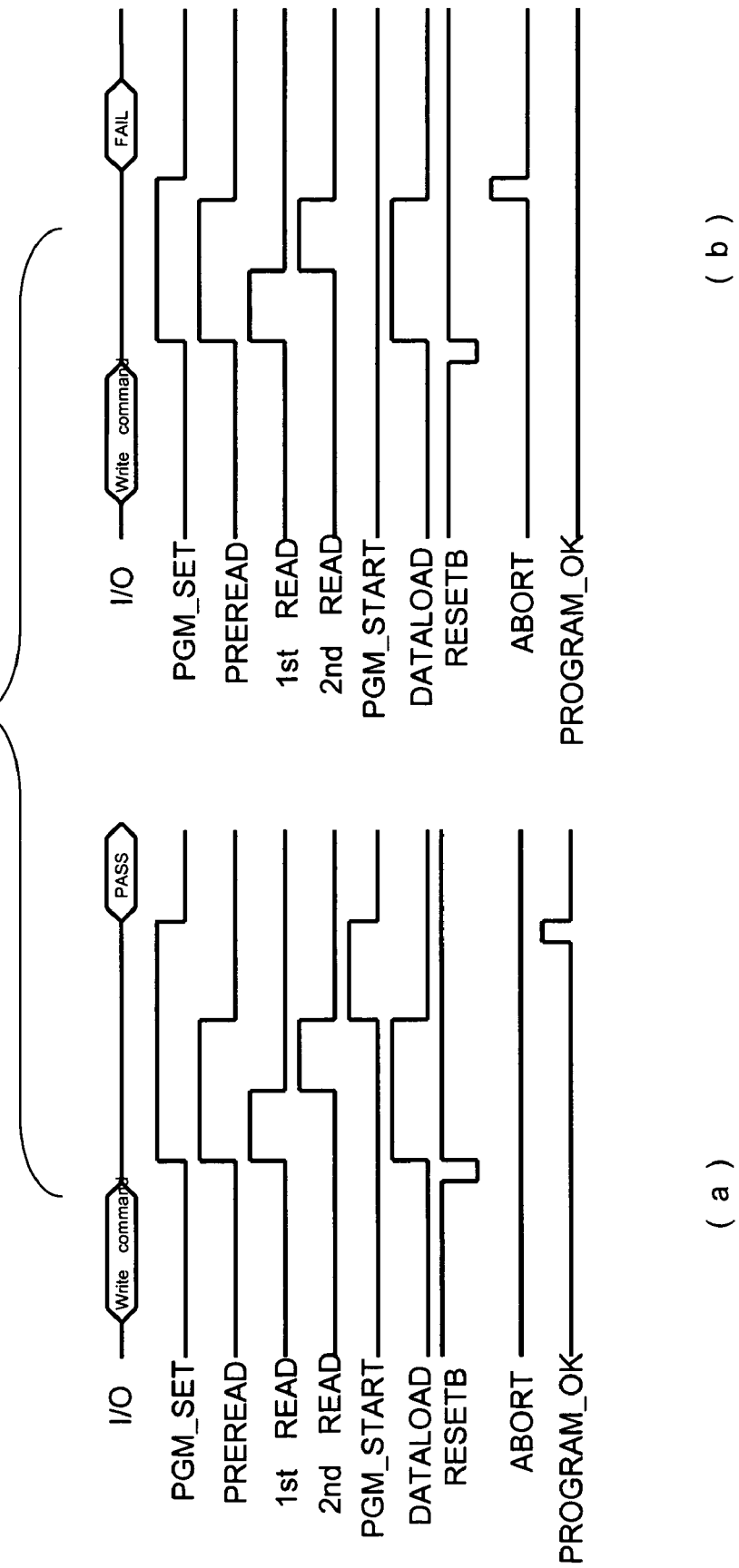
FIG. 10 is a timing chart of a programming operation in the first embodiment.

FIG. 10 is a timing chart of programming. A part (a) of FIG. 10 shows a sequence when the No_abort signal is generated, and a part (b) shows a sequence when the abort signal is generated.

The control circuit receives a write command, and raises the signal PGM_SET to HIGH due to acknowledgement of the write command. The signal PGM_SET changes the signal PREREAD for execution of the preread to HIGH. A signal $1^{st}$_READ changes to HIGH, and the first preread with the verify sense amplifier 53 is executed. Then, a signal $2^{nd}$_READ changes to HIGH, and the second preread with the verify sense amplifier 53 is executed. The reset signal RESETB changes to LOW before the signal PGM_SET changes to HIGH, and the data in the latch circuit of the data input buffer 4 is reset.

The signal DATALOAD switches to HIGH when the signal PREREAD switches to HIGH, and data is loaded to the data input buffer 4. When the abort signal from the abort check circuit 7 is LOW, the signal PGM_START can be switched to HIGH. The control circuit 2 initiates the actual programming when the signal PROGRAM_OK switches to HIGH, and the data output circuit 8 outputs the pass signal PASS to the outside of the semiconductor device 1 upon completion of the programming. When a write command of programming the memory cell to Level 3 (10) and this memory cell is at Level 2 (01), the abort check circuit 7 sets the abort signal to HIGH. Responsive to this abort signal, the control circuit 2 forcedly terminates the process without initiating programming instructed by the write command. It is thus possible to avoid erasing during programming. At that time, the data output circuit 8 outputs the signal Fail to the outside of the semiconductor device 1 in response to the abort signal. This makes it possible for a host system to acknowledge that the host system has issued the write command that is inhibited.

According to the first embodiment, the pattern that causes erasing during programming is detected by comparing the input write data with the data existing in the memory cell. The pattern thus detected is handled as an inhibited operation. When the inhibited operation is detected, the process is forcedly terminated without initiating the programming instructed by the write command, so that erasing during the programming can be prevented.

The existing data in the memory cell is read and sensed twice, so that the number of read circuits can be reduced and an increase of the chip size due to an increased number of read circuits can be avoided.

Second Embodiment

Figure 11:
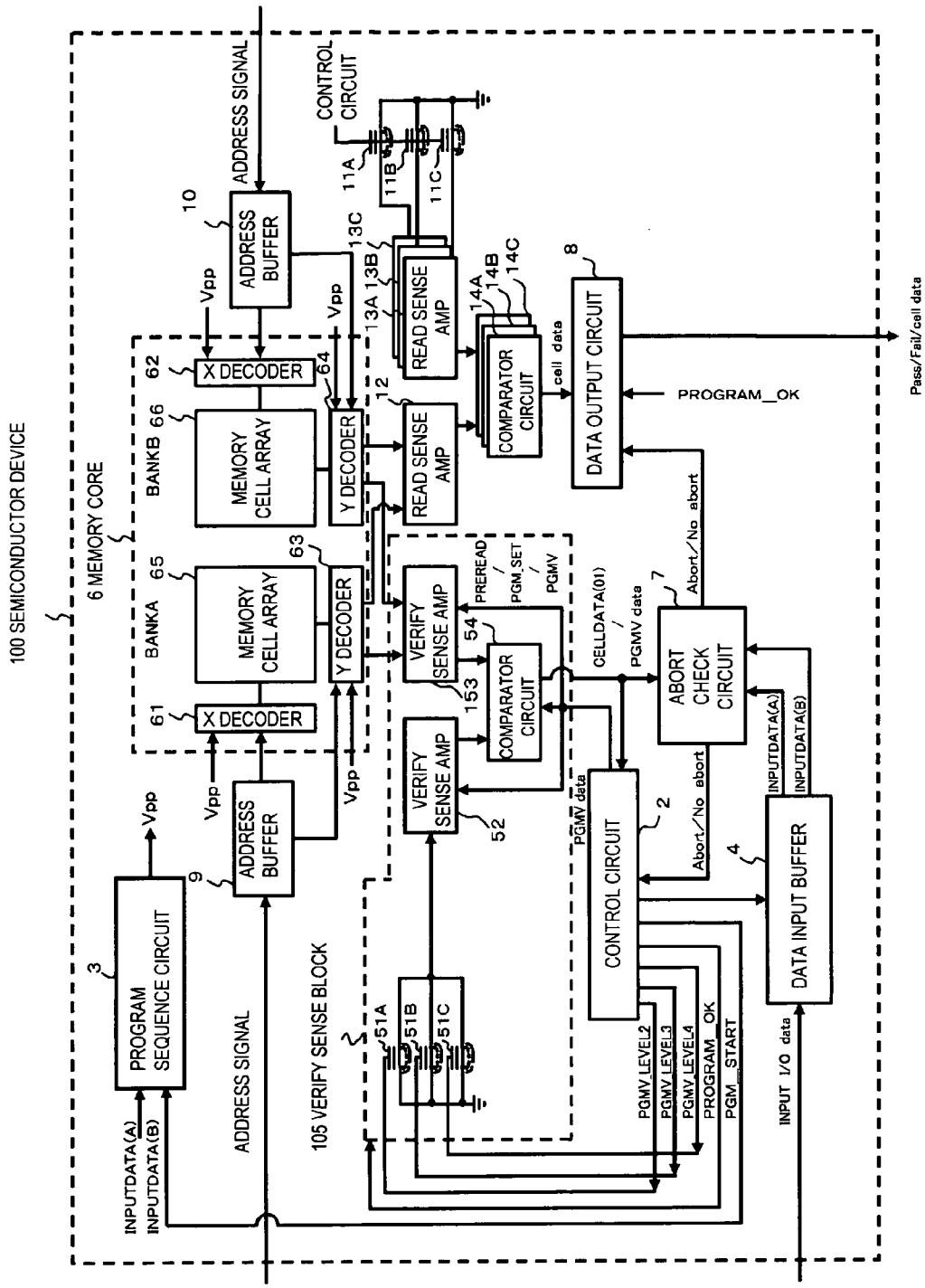
FIG. 11 is a detailed block diagram of a semiconductor device according to a second embodiment of the present invention.

Now, a second embodiment of the invention will be described. FIG. 11 is a detailed block diagram of a semiconductor device according to the second embodiment. As is shown in FIG. 11, a semiconductor device 100 includes the control circuit 2, the data input buffer 4, a verify sense amplifier block 105, the memory core 6, the abort check circuit 7, the data output circuit 8, the address buffers 9 an 10, the read reference cells 11, the read sense amplifier 12, 13A–13C, and the comparator circuits 14A–14C. The verify sense amplifier block 105 includes verify sense amplifiers 52 and 153, and the comparator circuit 54. The parts of the second embodiment that are also employed in the first embodiment are given the same reference numerals as previously, and a description thereof is here omitted.

Figure 12:
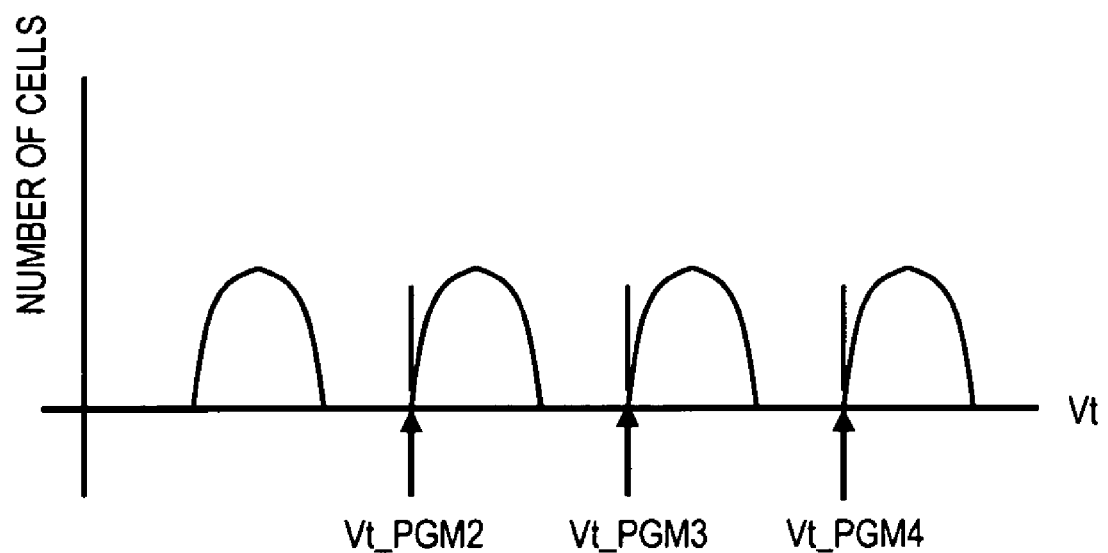
FIG. 12 shows threshold values Vth of a reference cell for programming and prereading.

FIG. 12 is a graph explaining the threshold values Vth of the reference cells 51. A threshold value Vt_PGM2 is the threshold value of the reference cell 51A used for verifying the programming so that it is determined whether the memory cell has been correctly programmed to Level 2 in the process of programming. A threshold value Vth_PGM3 is the threshold value of the reference cell 51B used for verifying the programming so that it is determined whether the memory cell has been correctly programmed to Level 3 in the process of programming. A threshold value Vth_PGM4 is the threshold value of the reference cell 51C used for verifying the programming so that it is determined whether the memory cell has been correctly programmed to Level 4 in the process of programming.

The second embodiment does not use the reference cells 51D and 51E for preread, but uses, for preread, the reference cell 51A for PGM_LEVEL2 and the reference cell 51B for PGM_LEVEL3. The reference cell 51B for PGM_LEVEL3 is used for the first preread, and the reference cell 51A for PGM_LEVEL2 is used for the second preread. In this case, if data in the memory cell is read with the verify sense amplifier shown in FIG. 7 without any modification, the sufficient read margin for Level 2 or Level 3 will not be obtained. With the above in mind, the second embodiment employs the verify sense amplifier 153 shown in FIG. 13 in order to secure the sufficient read margin.

FIG. 13 is a diagram of a circuit configuration of the verify sense amplifier employed in the second embodiment. As is shown in FIG. 13, the verify sense amplifier 153 includes PMOS transistors 531a, 531b and 531c, NMOS transistors 532a–532d, a NAND circuit 533, a load 534, and an inverter 536. The parts of the verify sense amplifier 153 that are also employed in the verify sense amplifier 53 are given the same reference numerals as previously, and a description thereof is here omitted.

In order to secure the sufficient read margin, according to the second embodiment, as shown in FIG. 13, the PMOS transistor 531c, which bypasses a part of the load 534, is added in order to reduce the load of the verify sense amplifier 153 when the signal PREREAD switches to HIGH. The PMOS transistor 531c shifts the level of the existing data in the memory cell at the time of preread. This shifts CELLDATA available at the node N2 to a higher potential when the signal PREREAD is HIGH. That is, in the sensing of the memory cell storing data "0", the memory cell can be sensed as if the memory cell has a threshold value higher than the regular threshold value for "0". This means an increase in the read margin for data "0".

Figure 14:
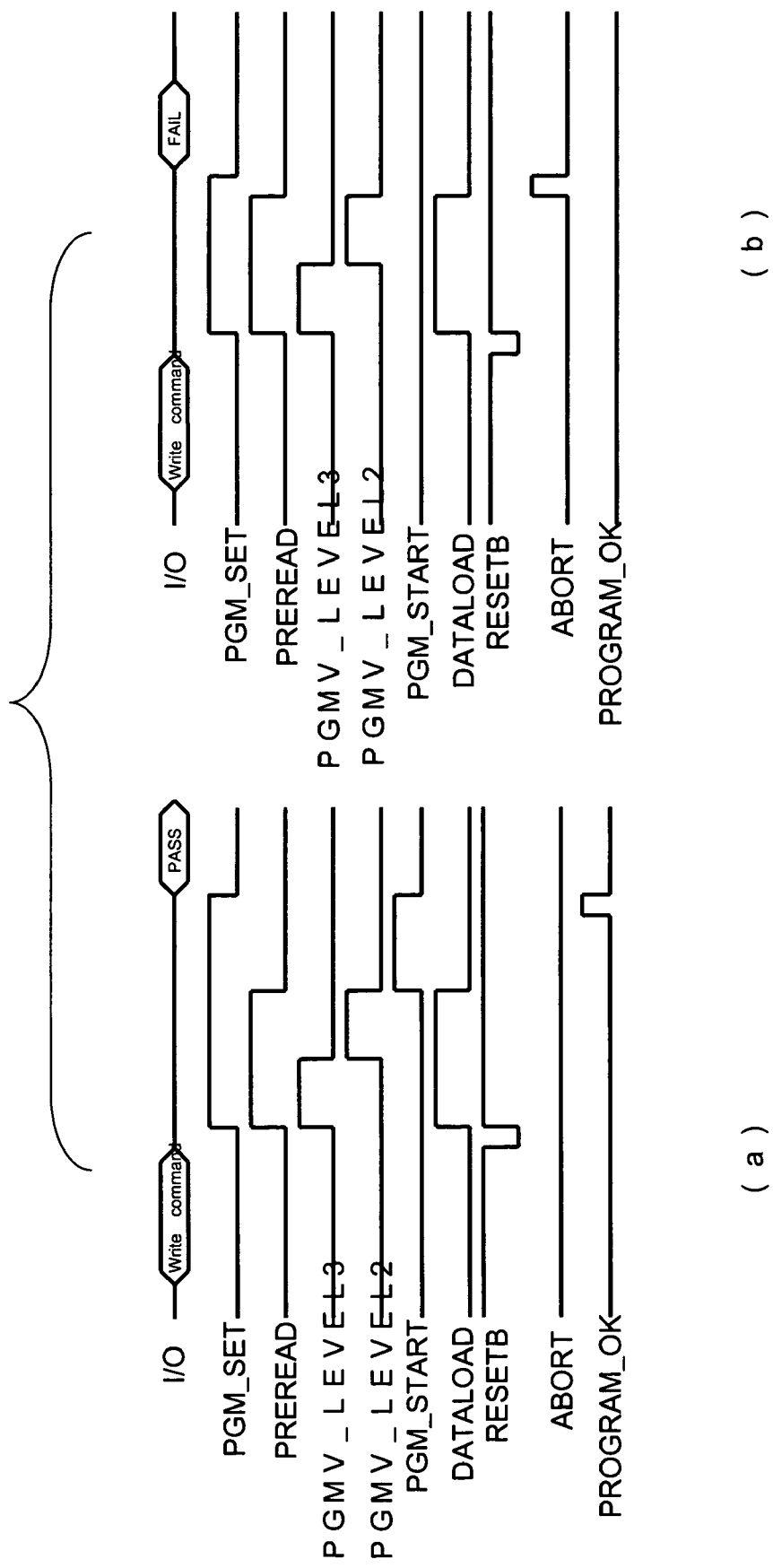
FIG. 14 is a timing chart of a programming operation in the second embodiment.

FIG. 14 is a timing chart of programming in the second embodiment. A part (a) of FIG. 14 shows a sequence when the No_abort signal is generated, and a part (b) shows a sequence when the abort signal is generated. In this exemplary operation, the signals $1^{st}$_READ and $2^{nd}$_READ shown in FIG. 10 are replaced by PGMV_LEVEL3 and PGMV_LEVEL2, respectively. The control circuit 2 receives the write command, and switches the signal PGM_SET indicative of acknowledgement of the write command to HIGH. This signal PGM_SET changes the signal PREREAD for execution of preread to HIGH. When the signal PGMV_LEVEL3 signal is HIGH, the first preread is performed using the verify sense amplifier 153. When the signal PGMV_LEVEL2 is HIGH, the second preread is performed using the verify sense amplifier 153.

In the first preread, the verify sense amplifier 153 has a reduced load in the following sequence. The signal PREREAD switches to HIGH, and the output of the inverter 536 changes to LOW. Thus, the PMOS transistor 531c is turned ON, and the load 534 is changed to the preread use in which the load 534 has the reduced load. Thus, the potential CELLDATA at the node N2 shifts to a higher level.

The control circuit 2 applies a voltage to the word line connected to the reference cell 51B with the threshold value Vt_PGM3. The verify sense amplifier 52 senses the current flowing through the reference cell 51B, and converts it into the corresponding voltage, which is then supplied to the comparator circuit 54. The comparator circuit 54 refers to the data from the reference cell 51B, and determines whether the existing data in the memory cell is at Level 1, 2 or Level 3, 4. In the second preread, the verify sense amplifier 153 has the reduced load in the same sequence as described above. That is, the signal PREREAD switches to HIGH, and the output of the inverter 536 changes to LOW. Thus, the PMOS transistor 531c is turned ON, and the load 534 is changed to the preread use in which the load 534 has the reduced lode. Thus, the potential CELLDATA at the node N2 shifts to a higher level.

The control circuit 2 applies a voltage to the word line connected to the reference cell 51A with the threshold value Vt_PGM2. The verify sense amplifier 52 senses the current flowing through the reference cell 51A, and converts it into the corresponding voltage, which is then supplied to the comparator circuit 54. The comparator circuit 54 refers to the data from the reference cell 51A, and determines whether the existing data in the memory cell is at Level 1 or Level 2. The reset signal RESETB changes to LOW prior to switching of the signal DATALOAD to HIGH, and the data in the latch circuit of the data input buffer 4 is reset. The signal DATALOAD changes to HIGH when the signal PREREAD switches to HIGH, and data is thus load to the data input buffer 4.

The abort check circuit 7 does not set the abort signal to HIGH in cases other than the case where the memory cell is determined as being at Level 2 and a command of programming this memory cell to Level 3 is input. The control circuit 2 changes the signal PGM_START to HIGH when the abort signal is LOW, so that the actual programming is initiated. The control circuit changes the signal PROGRAM_OK to HIGH upon completion of the programming, and the data output circuit 8 outputs the signal PASS to the outside of the semiconductor device 100.

The abort check circuit 7 changes the abort signal to HIGH when the write command of programming the memory cell to Level 3 and this memory cell is at Level 2. At that time, the data output circuit 8 outputs the signal Fail to the outside of the semiconductor device 100. In this manner, the process is forcedly terminated without initiating the programming instructed by the write command, so that erasing during the programming can be avoided.

According to the second embodiment, the verify sense amplifier 153 is changed to have the load appropriate to the preread at the time of the preread, so that read using the sense ratio with a certain margin can be realized. Further, there is no need to additionally provide the reference cells exclusively used for the preread.

Third Embodiment

Figure 15:
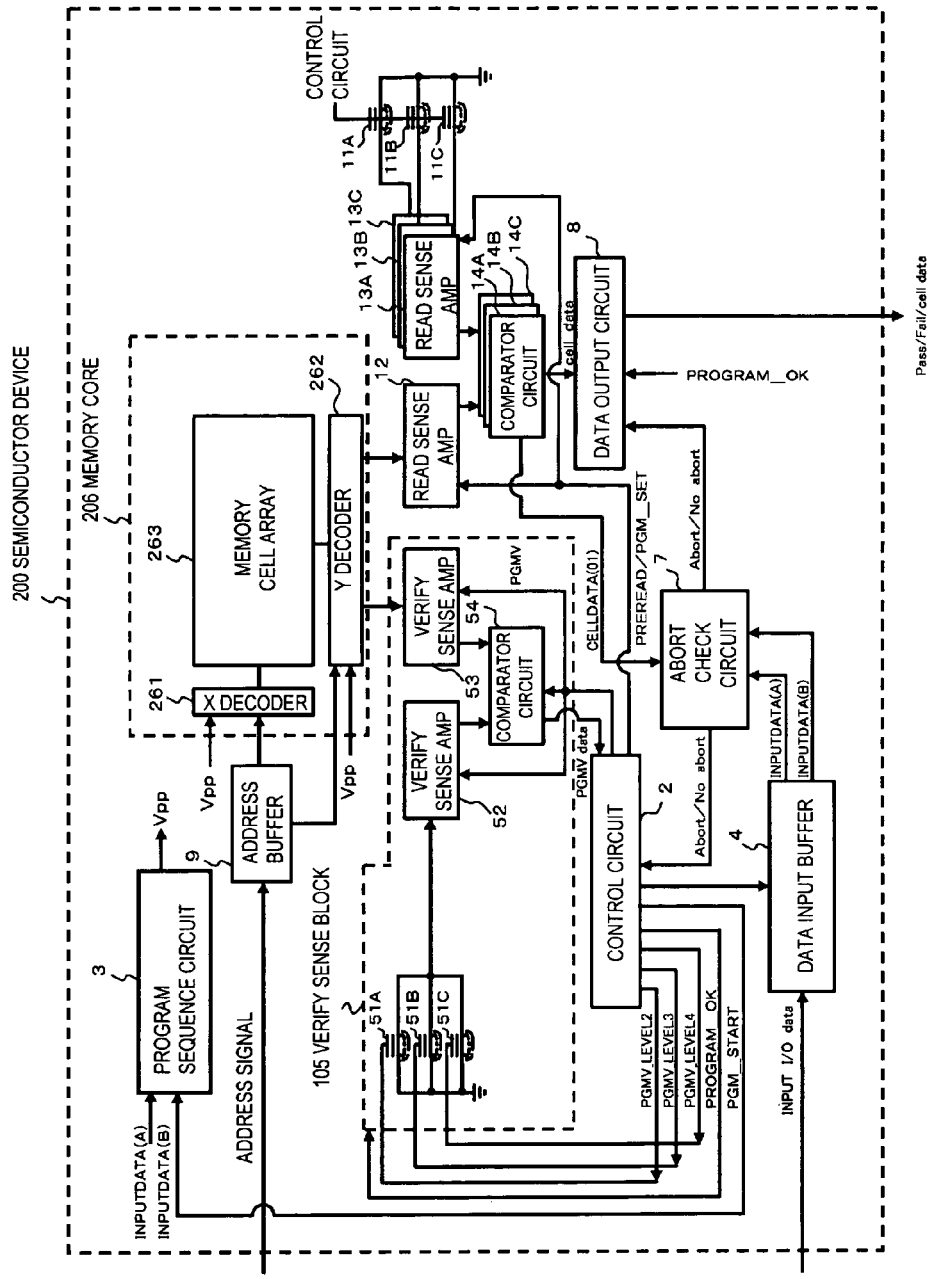
FIG. 15 is a detailed block diagram of a semiconductor device according to a third embodiment.

Now, a third embodiment will be described. The first and second embodiments are the flash memories with the SO function. In contrast to these flash memories, the third embodiment is applied to a conventional flash memory without the SO function. FIG. 15 is a detailed block diagram of a semiconductor device according to the third embodiment. As is shown in FIG. 15, a semiconductor device 200 includes the control circuit 2, the data input buffer 4, the verify sense amplifier 105, a memory core 206, the abort check circuit 7, the data output circuit 8, the address buffer 9, the read reference cells 11, the read sense amplifier 12 and 13A–13C, and the comparator circuits 14A–14C. The parts of the third embodiment that are also employed in the first and second embodiments are given the same reference numerals as previously, and a description thereof is here omitted. The third embodiment does not have a situation in which a bank is involved in programming and another bank is concurrently involved in reading. Thus, the preread is implemented by using the read sense amplifier 12.

FIG. 16 is a timing chart of programming in the third embodiment. A part (a) of FIG. 16 shows a sequence when the No_abort signal is generated, and a part (b) shows a sequence when the abort signal is generated. The control circuit 2 receives the write command, and switches the signal PGM_SET indicative of acknowledgement of this command to HIGH. The signal PGM_SET changes the PREREAD for execution of the preread to HIGH, and the existing data is read by the once preread operation that is the same as the regular read operation using the read sense amplifier 12.

More specifically, the voltage (Vgate) is applied to the word lines WL connected to the memory cell array 263 and the word like WL connected to the reference cells 11. The read sense amplifier 12 converts the current flowing through the memory core cell into the corresponding voltage. The read sense amplifiers 13A–13C convert the currents flowing through the reference cells 11A–11C and convert these currents into corresponding voltages, which are then supplied to the three comparator circuits 14A–14C. Then, the comparator circuits 14A–14C compare the level of the memory core cell with the levels from the read sense amplifiers 13A–13C, and identify the cell data, which is sent to the abort check circuit 7 as CELLDATA(01).

The reset signal changes to LOW before the signal DATALOAD changes to HIGH, and the data in the latch circuit of the data input buffer 4 is thus reset. The signal DATALOAD changes to HIGH when the signal PREREAD changes to HIGH, and data is loaded in the data input buffer 4. When the abort signal from the abort check circuit 7 is at LOW, the control circuit 2 changes the signal PGM_START to HIGH, and the programming is actually initiated. When the programming is correctly completed, the signal PROGRAM_OK changes to HIGH, and the data output circuit 8 outputs the pass signal PASS to the outside of the semiconductor device 200.

The abort check circuit 7 sets the abort signal to HIGH when data to be written into the memory cell is at Level 3 (10) and this memory cell is at Level 2 (01). Responsive to this abort signal, the control circuit 2 forcedly terminates the process without initiating the programming instructed by the command. This can avoid erasing during the programming. At that time, the data output circuit 8 receives the abort signal and outputs the signal Fail to the outside of the semiconductor device 200. This makes it possible for a host system to acknowledge that the host system has issued the write command that is inhibited.

As described above, the semiconductor device without the SO function does not need the twice-performed preread employed in the first and second embodiments because the read sense amplifier 12 can be used for the preread. As in the case of the regular read operation, the existing data can be read by the once-performed preread. Thus, the waves of the $1^{st}$ and $2^{nd}$_READ shown in FIG. 10 in the first embodiment are no longer needed, but the preread can be performed in accordance with the signal PREREAD.

As has been described regarding the first and second embodiments, the preread may be performed using the verify sense amplifier 53. In this case, the twice-performed preread is needed.

According to the third embodiment directed to the semiconductor device without the SO function, the input write data is compared with the existing data in the memory cell to detect the pattern causing erasing during programming. It is thus possible to avoid the event of erasing during the programming.

What is claimed is:

1. A semiconductor device comprising:
a memory part that includes memory cells having different threshold values;
a read circuit that reads data from a memory cell to be programmed with write data that is input;
a detection circuit that compares the write data with the data read from the memory cell to thus detect a pattern in which programming of data causes erasing, further comprising a sense amplifier for verification, wherein the read circuit reads data from said memory cell by using the sense amplifier for verification so that the data read from said memory cell is compared with specific reference cells provided separate from reference cells for verification.

2. A semiconductor device comprising:
a memory part that includes memory cells having different threshold values;
a read circuit that reads data from a memory cell to be programmed with write data that is input;
a detection circuit that compares the write data with the data read from the memory cell to thus detect a pattern in which programming of data causes erasing, further comprising a sense amplifier for verification, wherein the read circuit reads data from said memory cell by using the sense amplifier for verification so that the data read from said memory cell is compared with reference cells for verification.

3. The semiconductor device as claimed in claim 2, wherein the read circuit reads data from said memory cell twice through the sense amplifier for verification.

4. The semiconductor device as claimed in claim 2, wherein the memory part includes banks that are simultaneously operable.

5. The semiconductor device as claimed in claim 2, wherein:
the memory part includes banks that are simultaneously operable; and
the banks share the read circuit and the detection circuit.

6. The semiconductor device as claimed in claim 2, wherein the sense amplifier for verification comprises a transistor circuit that shifts a read level at which data is read from said memory cell.

7. The semiconductor device as claimed in claim 2, further comprising a circuit that outputs a result of detection by the detection circuit to an outside of the semiconductor device.

8. The semiconductor device as claimed in claim 2, wherein the semiconductor device is a semiconductor memory device.

9. The semiconductor device as claimed in claim 2, wherein the different threshold values are three or more different threshold values.

10. A semiconductor device comprising:
a memory part that includes memory cells having different threshold values;
a read circuit that reads data from a memory cell to be programmed with write data that is input;
a detection circuit that compares the write data with the data read from the memory cell to thus detect a pattern in which programming of data causes erasing, further comprising a sense amplifier for verification, wherein the read circuit reads data from said memory cell by using the sense amplifier for verification at a specific sense ratio different from that used for verification.

* * * * *